United States Patent [19]

Sugiura

[11] Patent Number: 5,316,201
[45] Date of Patent: May 31, 1994

[54] BONDING APPARATUS

[75] Inventor: Kazuo Sugiura, Tokyo, Japan

[73] Assignee: Kabushiki Kaisha Shinkawa, Tokyo, Japan

[21] Appl. No.: 869,487

[22] Filed: Apr. 15, 1992

[30] Foreign Application Priority Data

Apr. 16, 1991 [JP] Japan ................... 3-109690

[51] Int. Cl.⁵ ............................................. H05K 13/06
[52] U.S. Cl. ................................... 228/4.5; 228/180.5
[58] Field of Search ............... 228/1.1, 4.5, 6.2, 44.7, 228/110.1, 180.5

[56] References Cited

U.S. PATENT DOCUMENTS

| 3,940,047 | 2/1976 | Laub et al. | 228/4.5 |
| 5,156,318 | 10/1992 | Suzuki et al. | 228/4.5 |
| 5,180,094 | 1/1993 | Yanagida et al. | 228/4.5 |
| 5,207,370 | 5/1993 | Mochida et al. | 228/1.1 |

Primary Examiner—Samuel M. Heinrich
Attorney, Agent, or Firm—Koda and Androlia

[57] ABSTRACT

A bonding apparatus including a motor, a cam, a capillary, and a biasing means. The motor rotates both ways, the cam on the output shaft of the motor is rotated by the motor, and the capillary is moved downwardly when the motor and cam rotate forward. The biasing means urges the cam to rotate in a reverse direction in order to prevent the capillary from moving downwardly when the power of the bonding apparatus is turned off for some reason.

1 Claim, 4 Drawing Sheets

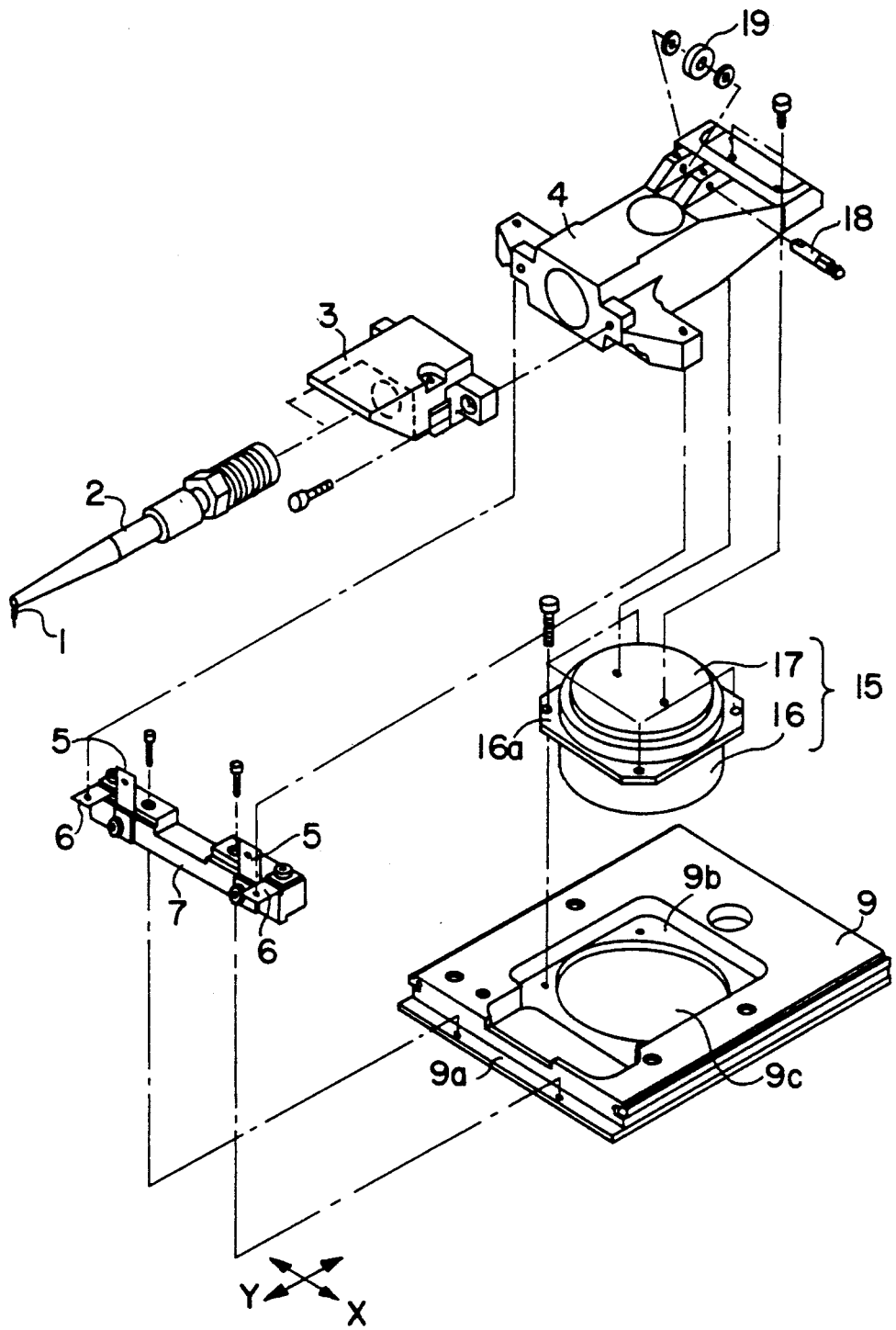
F I G. 1

BONDING APPARATUS

BACKGROUND OF THE INVENTION

1. Field of the Invention

The present invention relates to a bonding apparatus.

2. Prior Art

Several different kinds of bonding apparatuses are conventionally known. Among them, there is a bonding apparatus that has a cam and a motor that rotates both ways. The cam moves a capillary down when the motor rotates forward, and the cam moves the capillary up when the motor rotates in reverse.

In general, when the power of the bonding apparatus is turned on, a holding current or voltage is applied to a motor which moves a capillary and the output shaft of the motor is held so as not to be rotated. When a plus or minus current or a predetermined amount of voltage is applied to the motor, the output shaft of the motor is rotated.

As for the bonding apparatus in which the capillary is descended when the cam is rotated as described above, the holding of the output shaft of the motor is loosened when the power of the bonding apparatus is intentionally or unintentionally turned off. As a result, a cam shaft connected to the output shaft of the motor can be rotated freely.

In case that the cam shaft becomes free to rotate due to the power being off, the cam tends to rotate in a direction which moves the capillary so that it contacts a sample or a sample stand, resulting in a capillary that is damaged or a sample that is scratched because the capillary contacts the sample, etc,.

SUMMARY OF THE INVENTION

Accordingly, the object of the present invention is to provide a bonding apparatus that can prevent the damage of the capillary and avoid scratches on the sample, etc,.

The present invention is utilized in a bonding apparatus that is comprised of a motor that can rotate forward and reverse, a cam rotated by the motor, and a capillary moved downwardly when the motor rotates forward, and the object of the present invention is accomplished by a unique structure in which a biasing means is used so that the cam is urged to rotate in a reverse direction.

With this structure, the cam is prevented from being rotated forward when the power is turned off for some reason because the cam is urged to rotate reversely by a biasing means.

BRIEF DESCRIPTION OF THE DRAWINGS

FIG. 1 is a perspective view of the embodiment of the present invention which illustrates a portion of the bonding apparatus to be combined with another portion shown in FIG. 2;

DETAILED DESCRIPTION OF THE INVENTION

One embodiment of the present invention will be described with reference to FIGS. 1 through 5.

Figure 3:
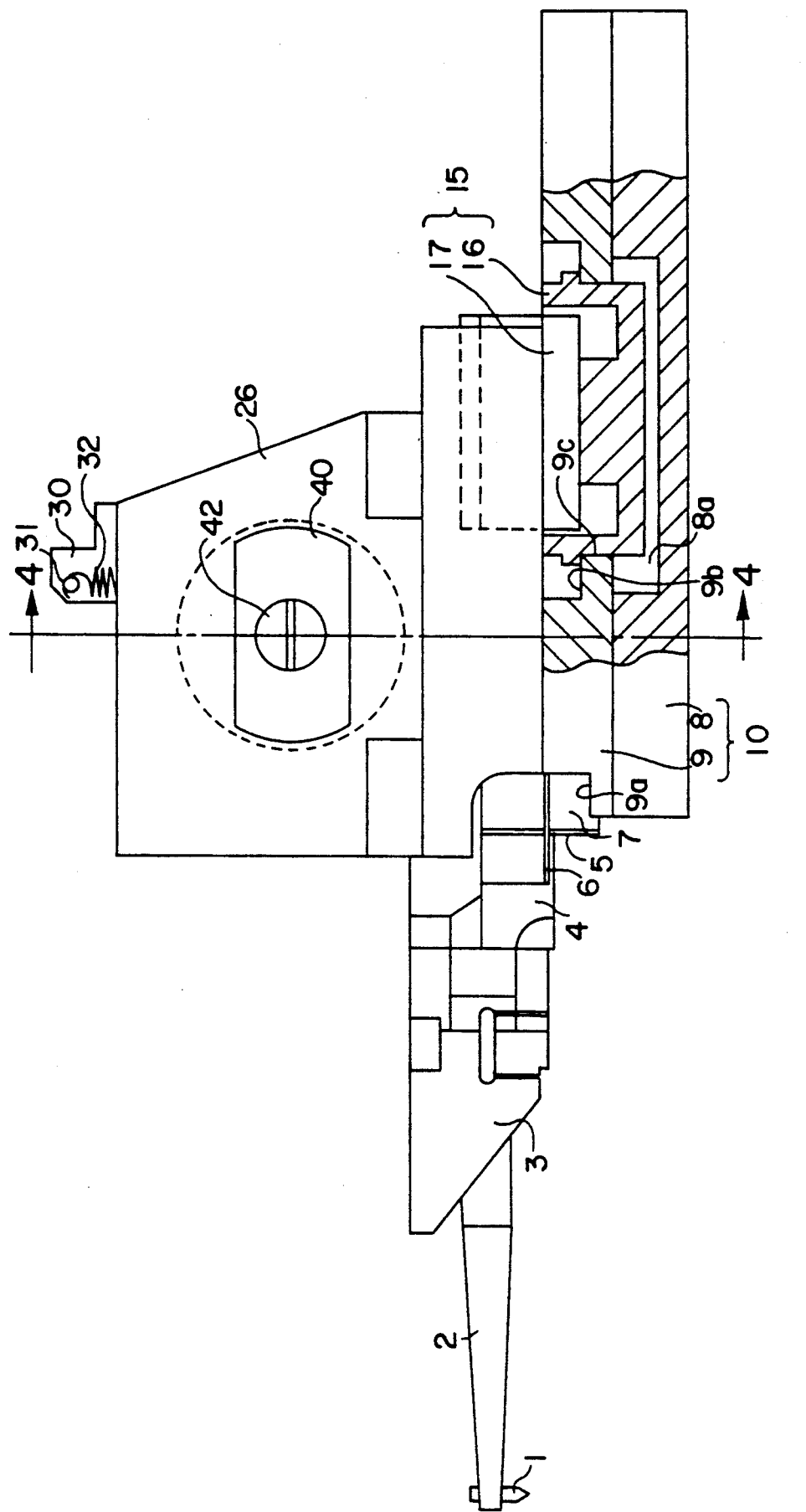
FIG. 3 is a schematic partial sectional side view of the portions shown in FIGS. 1 and 2.

As shown in FIG. 1 and FIG. 3, a capillary 1 is mounted on one end of a horn 2, and the other end of the horn 2 is connected to a horn holder 3. The horn holder 3 is mounted to a lifter arm 4 to which one end of each one of the plate springs 5 and 6 is connected. The plate springs 5 are disposed vertically and the plate springs 6 are disposed horizontally, and the other end of each one of the plate springs 5 and 6 are connected to a fulcrum block 7.

An X-Y table 10 consists of an X table 8 and a Y table 9. The Y table 9 is positioned on the X table 8. The fulcrum block 7 is provided on a fulcrum block mounting face 9a formed at a lower position on the front side of the Y table 9 of the X-Y table 10.

A linear motor 15 is comprised of a magnet section 16, a coil section 17, and a fitting section 16a. A linear motor mount 9b is formed on the Y table 9 so that the fitting portion 16a is embedded therein, the linear motor 15 is thus fixed in the linear motor mount 9b. In addition, holes 8c and 9c are formed in the X table 8 and the Y table 9, respectively, for housing the magnet section 16 of the linear motor 15 therein. The hole 8a provided on the X table 8 is elongated in shape along the Y direction so that the magnet section 16 of the linear motor 15 can be moved in the Y direction without any interference with the X table 8.

The lifter arm 4 is provided on the coil portion 17 of the linear motor 15, and a shaft 18 on which a roller 19 is rotatably provided is fixed on the lifter arm 4.

Figure 2:
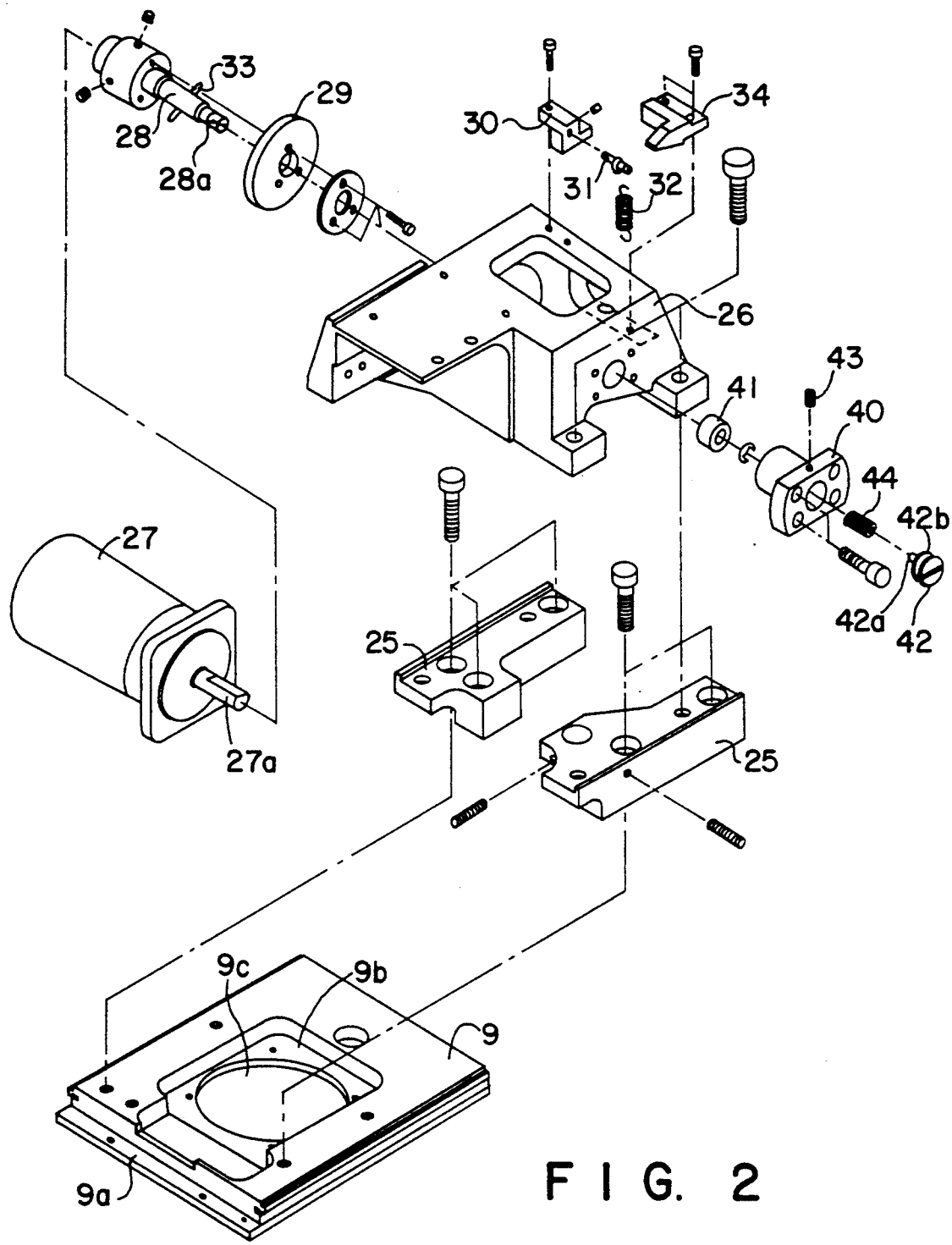
FIG. 2 is a perspective view of the embodiment of the present invention which illustrates the other portion of the bonding apparatus.
Figure 4:
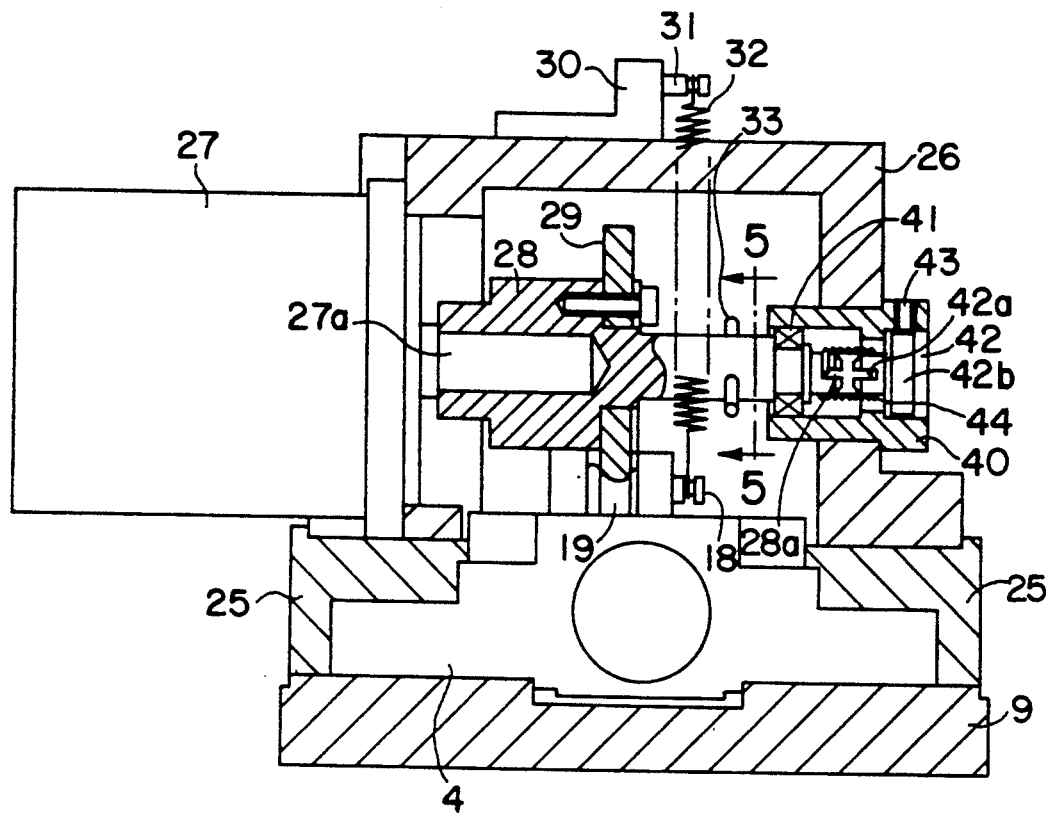
FIG. 4 is a sectional view taken along the line A—A in FIG. 3.

As shown in FIGS. 2 and 4, a pair of mounting plates 25 are provided on the Y table 9. The mounting plates 25 are used for installing a detector (not shown) that detects the touchdown of the capillary to the sample.

A casing 26 is provided on the mounting plates 25, and a motor 27 that can rotate forward and backward is fixed to the casing 26. A cam shaft 28 which has a spring groove 28a at the tip end is connected to an output shaft 27a of the motor 27, and a cam 29 is provided on the cam shaft 28 so that the outer circumference of the cam 29 comes into contact with the outer circumference of the roller 19.

A spring peg fixing plate 30 with a spring peg 31 is fastened to the casing 26, and a spring 32 is hooked up between the spring peg 31 and the shaft 18. As a result, the roller 19 is urged to contact the cam 29 by the spring 32.

Figure 5:
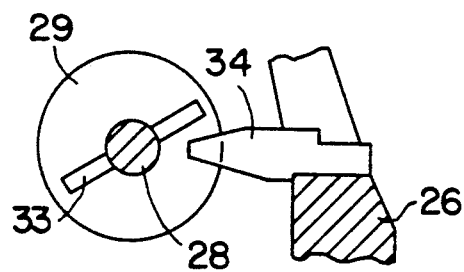
FIG. 5 is a partial sectional view taken along the line B—B in FIG. 4.

In order to control the rotating range of the cam shaft 28, a pin 33 is provided on the cam shaft 28 so that both ends of the pin 33 protrude from the cam shaft 28, and a stopper 34 is provided on the casing 26 so that the tip end of the stopper 34 comes into contact with the pin 33 when the cam shaft 28 is rotated as shown in FIG. 5.

Therefore, in this embodiment, the cam shaft 28 is rotated back and forth within the range of approximately 160 degrees. In the rotating range of the cam shaft 28, the profile of the cam 29 to which the roller 19 contacts is used as a descending profile when the motor 27 is rotated forward, while the profile is used as an ascending profile when the motor 27 is rotated backward.

A receiving member 40 is installed on the side wall of the casing 26, and a bearing 41 is provided in the receiving member 40 so that the front end of the cam shaft 28 is rotatably supported thereby. A spring peg 42, which has a spring hooking groove 42a and a groove 42b, is provided in the receiving member 40 and fixed by a screw 43 that fits into the groove 42b.

A spring 44 positioned in the receiving member 40 is hooked up between the spring hooking groove 42a of the spring peg 42 and the spring peg groove 28a of the cam shaft 28. The spring 44 is used as a biasing means. The spring 44 urges the cam shaft 28 so that the cam shaft 28 is turned reversely. The force of the spring 44 can be controlled by the spring peg 42 that is rotated after loosing the screw 43.

As described above, the lifter arm 4 is provided on the Y table 9 and connected thereto by the plate springs 5 and 6, and the horn 2 is connected to the lifter arm 4 by the horn holder 3. Accordingly, the capillary 1 connected to the horn 2 is moved along with the Y table in the X-Y direction when the X-Y table 10 is driven in the X-Y direction by a driving means (not shown).

Since the roller 19 provided on the lifter arm 4 is kept in contact with the cam 29 by the spring 32, the roller 19 is moved upwardly when the motor 27 rotates forward. As a result, the lifter arm 4 is swung by using the plate springs 5 and 6 as fulcrums, thus moving the capillary 1 downwardly. In the same way, when the motor 27 rotates backward, the roller 19 is moved downwardly, thus moving the capillary 1 upwardly.

Next, the operation of the bonding apparatus of the present invention will be described below.

A ball is formed by an electric torch (not shown) at the tip end of a wire (not shown) that is inserted through the capillary 1, then the X-Y table 10 is driven so that the capillary 1 is positioned above the first bonding point.

After these movements, the motor 27 rotates forward and the capillary 1 is moved downwardly by the cam 29 that urges the roller 19 downwardly. Therefore, the ball is come into contact with the first bonding point. The bonding level of the first bonding point is detected by a detector (not shown), and the motor 27 stops for a predetermined period of time after the detection.

The linear motor 15 is actuated by the detection signal of the detector, and the coil 17 is repulsed by the magnet 17. As a result, the lifter arm 4 is pushed up and swung by using the spring plates 5 and 6 as fulcrums, and the capillary 1 presses the ball against the first bonding point. More specifically, the bonding load of the capillary 1 is determined by the electric current or voltage applied to the linear motor 15, and the ball is bonded to the first bonding point by the bonding load of the capillary.

The linear motor 15 stops after a predetermined period of time, then the motor 27 rotates reversely. As a result, the capillary 1 is moved upwardly. The rotation of the motor 27, that is, the upward movement of the capillary 1, is determined based upon the signal of the bonding level detected by the detector so that an enough length of the wire is fed out of the tip end of the capillary 1 to form a wire-loop.

Next, the X-Y table is driven to bring the capillary 1 to the position above the second bonding point. Thereafter, the wire is bonded to the second bonding point by the operation similar to that taken for bonding the first bonding point as described above. After the wire is bonded to the second bonding point, the clamper (not shown) is closed to hold the wire, and the capillary 1 is moved upwardly a predetermined distance. As a result, the wire is cut off from the point that is above the second bonding point.

If the power of the bonding apparatus is turned off for some reason, the holding of the output shaft 27a of the motor 27 is loosened, and the cam shaft 28 becomes free to rotate. However, in the embodiment of the present invention, the cam shaft 28 and the cam 29 are urged by the spring 44 so that the cam shaft 28 and the cam 29 are rotated in the direction that the capillary 1 is moved upwardly. Therefore, the cam 29 is prevented from rotating in the direction that the capillary 1 is moved downwardly.

According to the present invention, since the cam is urged by the biasing means, such as the spring 44, in the opposite direction that the capillary is moved upwardly, the capillary is not moved downwardly when the power of the bonding apparatus is turned off for some reason.

I claim:

1. A bonding apparatus comprising:
   a motor which is able to rotate forward and backward;
   a cam rotated forward and backward by said motor;
   a capillary moved downwardly by contacting an outer circumference of said cam used as a down profile when said motor and cam rotates backward; and
   a biasing means which urges said cam so as to rotate backward to move said capillary upwardly.

* * * * *